United States Patent
Ahrens et al.

(10) Patent No.: US 11,435,806 B2
(45) Date of Patent: Sep. 6, 2022

(54) AUTOMATIC VOLTAGE RECONFIGURATION

(71) Applicants: ADVANCED MICRO DEVICES, INC., Santa Clara, CA (US); ATI TECHNOLOGIES ULC, Markham (CA)

(72) Inventors: Jerry A. Ahrens, Austin, TX (US); Amitabh Mehra, Fort Collins, CO (US); Anil Harwani, Austin, TX (US); William R. Alverson, Austin, TX (US); Grant E. Ley, Austin, TX (US); Charles Sy Lee, Markham (CA)

(73) Assignees: ADVANCED MICRO DEVICES, INC., Santa Clara, CA (US); ATI TECHNOLOGIES ULC, Markham (CA)

( * ) Notice: Subject to any disclaimer, the term of this patent is extended or adjusted under 35 U.S.C. 154(b) by 0 days.

(21) Appl. No.: 16/715,184

(22) Filed: Dec. 16, 2019

(65) Prior Publication Data
US 2021/0181825 A1    Jun. 17, 2021

(51) Int. Cl.
*G06F 1/3234*    (2019.01)
(52) U.S. Cl.
CPC ................ *G06F 1/3234* (2013.01)
(58) Field of Classification Search
CPC .................................................. G06F 1/3234
USPC ....................................................... 713/320
See application file for complete search history.

(56) References Cited

U.S. PATENT DOCUMENTS

| | | | | |
|---|---|---|---|---|
| 7,447,602 B1 * | 11/2008 | Bradley | ........... | G01R 31/31718 702/60 |
| 8,943,334 B2 * | 1/2015 | Kumar | ................... | G06F 1/3296 713/300 |
| 9,323,300 B2 * | 4/2016 | Brock | ................... | G06F 1/3296 |
| 2004/0025069 A1 * | 2/2004 | Gary | ...................... | G06F 1/3296 713/300 |
| 2011/0153984 A1 * | 6/2011 | Wolfe | ................... | G06F 9/5027 712/42 |
| 2012/0260258 A1 * | 10/2012 | Regini | .................. | G06F 1/3287 718/104 |
| 2014/0181561 A1 * | 6/2014 | Shippy | .................. | G06F 1/3287 713/324 |
| 2015/0006915 A1 * | 1/2015 | Ganesan | ................... | G06F 1/26 713/300 |
| 2017/0102761 A1 * | 4/2017 | Campisano | ............... | G06F 1/08 |

(Continued)

OTHER PUBLICATIONS

Bacha et al., "Dynamic Reduction of Voltage Margins by Leveraging On-chip ECC in Itanium II Processors," ISCA'13 The 40th Annual International Symposium on Computer Architecture, Tel-Aviv, Israel, Jun. 14-19, 2013, Computer Architecture, ACM, Jun. 23, 2013, pp. 297-307.

(Continued)

*Primary Examiner* — Suresh Suryawanshi (57) ABSTRACT

Automatic voltage reconfiguration in a computer processor including one or more cores includes executing one or more user-specified workloads; determining, based on the user-specified workloads, a respective minimum safe voltage for each core of one or more cores; and modifying a respective voltage configuration for each core of the one or more cores based on the respective minimum safe voltage.

20 Claims, 5 Drawing Sheets

(56) References Cited

U.S. PATENT DOCUMENTS

2017/0357310 A1\* 12/2017 Hovis .................. G06F 1/28
2021/0018971 A1\* 1/2021 Rotem .............. G06F 9/4881

OTHER PUBLICATIONS

International Search Report and Written Opinion, PCT/US2020/065099, dated Mar. 19, 2021, 12 pages.

\* cited by examiner

AUTOMATIC VOLTAGE RECONFIGURATION

BACKGROUND

Central processing units are shipped with margins in their frequency voltage curve. The margins are set to ensure proper functionality of the central processing unit under "worst case" scenarios. These "worst case" scenarios typically do not reflect actual environmental and use case scenarios for the central processing units.

DETAILED DESCRIPTION

In some embodiments, a method of automatic voltage reconfiguration includes executing one or more user-specified workloads; determining, based on the user-specified workloads, a respective minimum safe voltage for each core of one or more cores; and modifying a respective voltage configuration for each core of the one or more cores based on the respective minimum safe voltage.

In some embodiments, determining the respective minimum safe voltage for each core of the one or more cores includes modifying, during execution of the one or more user-specified workloads, a respective operational voltage of each core of the one or more cores until a failure state is identified. In some embodiments, the method further includes receiving a selection of one or more predefined test patterns as the one or more user-specified workloads. In some embodiments, the respective voltage configuration includes a margin of a frequency voltage curve. In some embodiments, executing one or more user-specified workloads is based on one or more user interactions with one or more software applications. In some embodiments, the method further includes saving the respective minimum safe voltage for each core of the one or more cores to a storage location. In some embodiments, the method further includes loading, in response to a request to overclock the one or more cores, the respective minimum safe voltage for each core of the one or more cores.

In some embodiments, an apparatus for automatic voltage reconfiguration performs steps including executing one or more user-specified workloads; determining, based on the user-specified workloads, a respective minimum safe voltage for each core of one or more cores; and modifying a respective voltage configuration for each core of the one or more cores based on the respective minimum safe voltage.

In some embodiments, determining the respective minimum safe voltage for each core of the one or more cores includes modifying, during execution of the one or more user-specified workloads, a respective operational voltage of each core of the one or more cores until a failure state is identified. In some embodiments, the steps further include receiving a selection of one or more predefined test patterns as the one or more user-specified workloads. In some embodiments, the respective voltage configuration includes a margin of a frequency voltage curve. In some embodiments, executing one or more user-specified workloads is based on one or more user interactions with one or more software applications. In some embodiments, the steps further include saving the respective minimum safe voltage for each core of the one or more cores to a storage location. In some embodiments, the steps further include loading, in response to a request to overclock the one or more cores, the respective minimum safe voltage for each core of the one or more cores.

In some embodiments, a computer program product for automatic voltage reconfiguration disposed upon a computer readable medium includes computer program instructions that, when executed, cause a computer to perform steps including executing one or more user-specified workloads; determining, based on the user-specified workloads, a respective minimum safe voltage for each core of one or more cores; and modifying a respective voltage configuration for each core of the one or more cores based on the respective minimum safe voltage.

In some embodiments, determining the respective minimum safe voltage for each core of the one or more cores includes modifying, during execution of the one or more user-specified workloads, a respective operational voltage of each core of the one or more cores until a failure state is identified. In some embodiments, the steps further include receiving a selection of one or more predefined test patterns as the one or more user-specified workloads. In some embodiments, the respective voltage configuration includes a margin of a frequency voltage curve. In some embodiments, executing one or more user-specified workloads is based on one or more user interactions with one or more software applications. In some embodiments, the steps further include saving the respective minimum safe voltage for each core of the one or more cores to a storage location. In some embodiments, the steps further include loading, in response to a request to overclock the one or more cores, the respective minimum safe voltage for each core of the one or more cores.

Automatic voltage reconfiguration in accordance with the present application is generally implemented with computers, that is, with automated computing machinery. For further explanation, therefore, FIG. 1 sets forth a block diagram of automated computing machinery including an exemplary computer 100 configured for automatic voltage reconfiguration according to certain embodiments. The computer 100 of FIG. 1 includes at least one computer processor 102 or 'CPU' as well as random access memory 104 (RAM') which is connected through a high speed memory bus 106 and bus adapter 108 to processor 102 and to other components of the computer 100.

Figure 1:
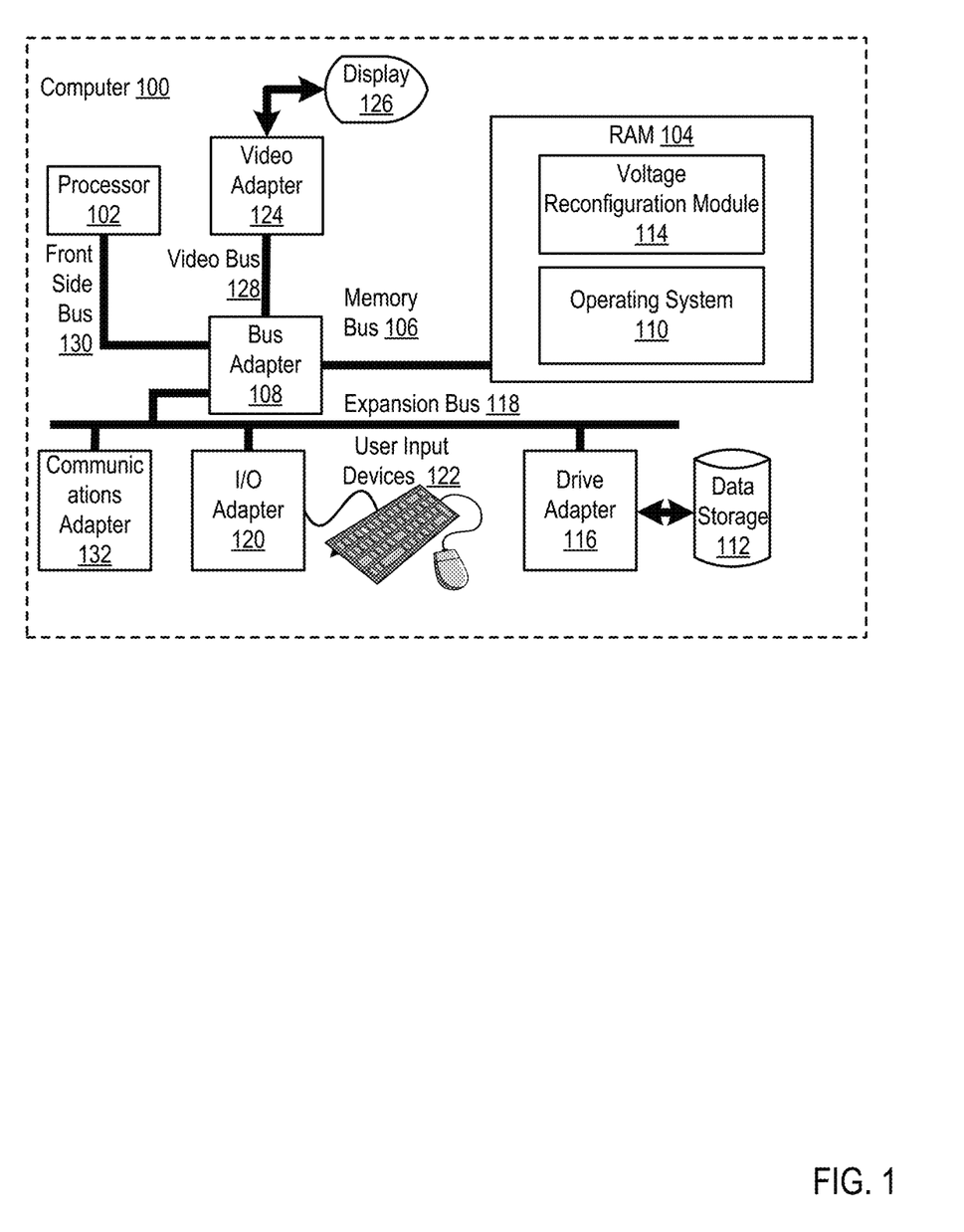
FIG. 1 is a block diagram of an example processor for automatic voltage reconfiguration according to some embodiments.

Stored in RAM 104 is an operating system 110. Operating systems useful in computers configured for automatic voltage reconfiguration according to certain embodiments include UNIX™, Linux™, Microsoft Windows™, and others as will occur to those of skill in the art. The operating system 108 in the example of FIG. 1 is shown in RAM 104, but many components of such software typically are stored in non-volatile memory also, such as, for example, on data storage 112, such as a disk drive. Also stored in RAM is the voltage reconfiguration module 114 a module for automatic voltage reconfiguration according to certain embodiments.

The computer 100 of FIG. 1 includes disk drive adapter 116 coupled through expansion bus 118 and bus adapter 108 to processor 102 and other components of the computer 100. Disk drive adapter 116 connects non-volatile data storage to the computer 100 in the form of data storage 112. Disk drive adapters useful in computers configured for automatic voltage reconfiguration according to certain embodiments include Integrated Drive Electronics ('IDE') adapters, Small Computer System Interface (SCSI') adapters, and others as will occur to those of skill in the art. In some embodiments, non-volatile computer memory is implemented as an optical disk drive, electrically erasable programmable read-only memory (so-called 'EEPROM' or 'Flash' memory), RAM drives, and so on, as will occur to those of skill in the art.

The example computer 100 of FIG. 1 includes one or more input/output (I/O') adapters 120. I/O adapters implement user-oriented input/output through, for example, software drivers and computer hardware for controlling output to display devices such as computer display screens, as well as user input from user input devices 122 such as keyboards and mice. The example computer 100 of FIG. 1 includes a video adapter 124, which is an example of an I/O adapter specially designed for graphic output to a display device 126 such as a display screen or computer monitor. Video adapter 124 is connected to processor 102 through a high speed video bus 128, bus adapter 108, and the front side bus 130, which is also a high speed bus.

The exemplary computer 100 of FIG. 1 includes a communications adapter 132 for data communications with other computers and for data communications with a data communications network. Such data communications are carried out serially through RS-232 connections, through external buses such as a Universal Serial Bus ('USB'), through data communications networks such as IP data communications networks, and/or in other ways as will occur to those of skill in the art. Communications adapters implement the hardware level of data communications through which one computer sends data communications to another computer, directly or through a data communications network. Examples of communications adapters useful in computers configured for automatic voltage reconfiguration according to certain embodiments include modems for wired dial-up communications, Ethernet (IEEE 802.3) adapters for wired data communications, and 802.11 adapters for wireless data communications.

Figure 2:
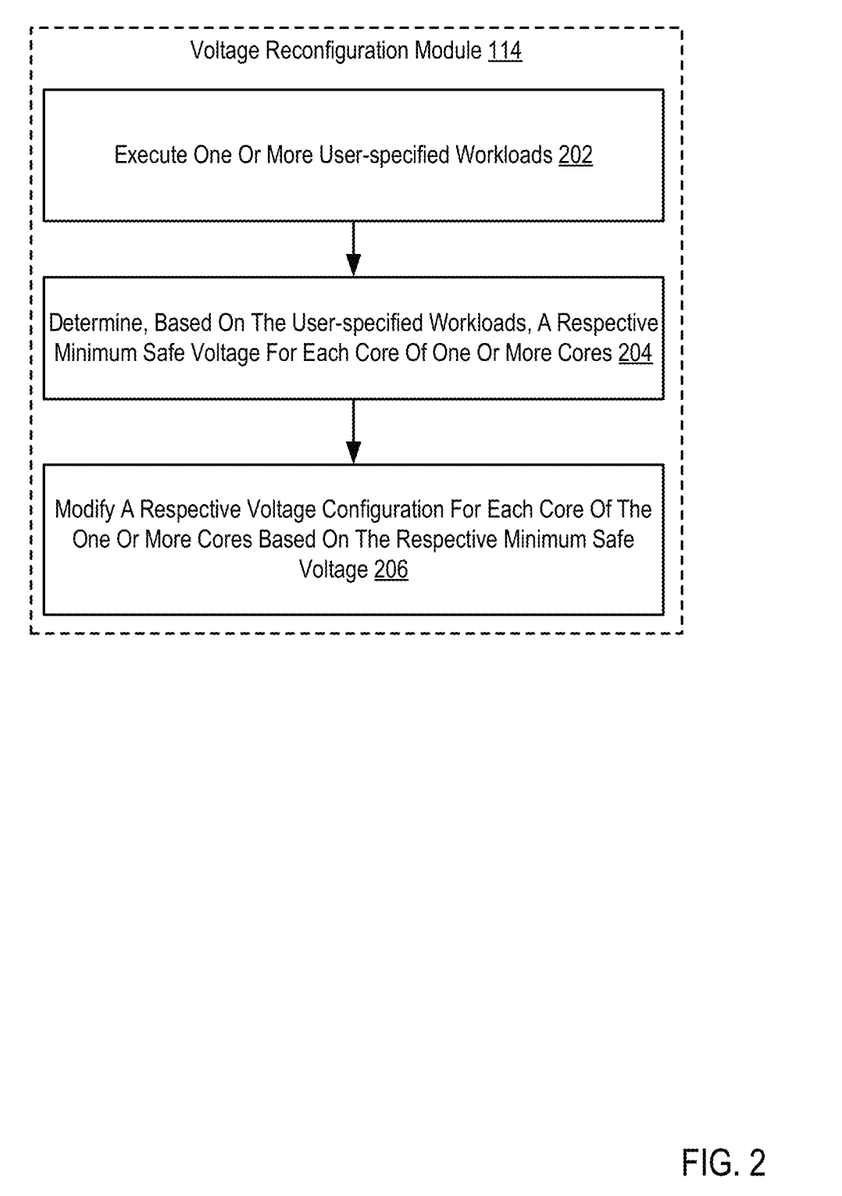
FIG. 2 is a flowchart of an example method for automatic voltage reconfiguration according to some embodiments.

For further explanation, FIG. 2 sets forth a flow chart illustrating an exemplary method for automatic voltage reconfiguration that includes executing 202 (e.g., by the voltage reconfiguration module 114) one or more user-specified workloads. In an embodiment, the one or more user-specified workloads include one or more predefined or pregenerated workloads. For example, the predefined workloads include predefined test patterns, test suites, stress tests, or other predefined groups of predefined operations. In an embodiment, the one or more user-specified workloads are selected from a plurality of test patterns. For example, each of the plurality of different test patterns include operations associated with a particular type of computation or application, such as graphics rendering, code compilation, data processing, etc.

In another embodiment, the one or more user-specified workloads are user-executed or user-initiated operations. For example, a user selects a software application or process for execution. The user then interacts with the executed software application. In other words, executing the one or more user-specified workloads is based on one or more user interactions with one or more software applications.

The method of FIG. 2 also includes determining 204, based on the user-specified workloads, a respective minimum safe voltage for each core of one or more cores. During execution of the one or more user-specified workloads (e.g., during the execution of one or more selected predefined test patterns, during user interactions with one or more software applications) the voltage reconfiguration module 114 modifies an operational voltage of one or more cores. For example, the voltage reconfiguration module 114 configures the one or more cores to operate at varying voltages until a predefined condition is satisfied. Continuing this example, the voltage reconfiguration module 114 reduces the operational voltage for each core by a predefined interval or increment until a predefined condition is satisfied. Predefined conditions include failure to complete a function or operation, generating an exception in code execution, failure to complete a function or operation within a predefined time window, etc. The minimum safe voltage for a given core is then determined to be the last operational voltage at which the predefined condition was not met (e.g., prior to reducing the operational voltage and causing the predefined condition to be satisfied).

The method of FIG. 2 also includes modifying 206 a respective voltage configuration for each core of the one or more cores based on the respective minimum safe voltage. In an embodiment, the respective voltage configuration includes a margin for a frequency voltage curve. For example, each core corresponds to a frequency voltage curve defining, for a given operational voltage, a corresponding frequency for the core. Each frequency voltage curve includes a minimum and maximum voltage at which the corresponding core can operate. Accordingly, modifying the respective voltage configuration includes reducing a minimum voltage of the frequency voltage curve. Thus, after modification, each core has a lower possible minimum operating voltage. In other words, a reduced minimum voltage for undervolting is established.

In an embodiment, modifying a respective voltage configuration for each core to operate at a lower possible minimum operating voltage, but does not necessarily cause the cores to operate at that minimum operating voltage. For example, in an embodiment, the operating voltage of a core is not reduced (e.g., to the determined minimum safe voltage) until a request or other input is provided to change the operating voltage of the core. In an embodiment, by virtue of operating at a lower operating voltage, a frequency of a given core is then increased (e.g., overclocked) according to the modified frequency voltage curve. For example, a system management unit automatically adjusts the frequency of a given core based on the core's operating voltage.

As described above, the minimum safe voltage for each core is determined based on user-specified workloads. Prior to distribution, a chip is tested to be functional under "worst case" conditions (e.g., under particular stress tests, under higher thermal conditions, etc.). The frequency voltage curve for the chip (e.g., for each core) with operational margins to guarantee operation of the chip under these "worst case" conditions. Typical user operations do not approach these worst case conditions. For example, a user system with adequate or high end cooling will not reach the worst case thermal conditions under which the chip was tested. As another example, particular stress tests applied to a chip will not reflect typical user operations for the chip. In other words, a chip is constrained to satisfy test conditions that do not reflect the environment and workloads under which the chip will ultimately operate.

For example, assume that a chip was tested and found that, at a particular voltage, only a code compilation stress test causes the chip to fail. The frequency voltage curve of the chip is then modified to avoid this voltage. For example, a minimum voltage of the frequency voltage curve is set to be greater than the voltage at which the code compilation stress test failed. For users who are unlikely or will never perform similar code compilation operations, this places an unnecessary restriction on the chip. To overcome this restriction, the voltage reconfiguration module 114 determines the minimum safe voltage for the user-specified workloads (e.g., predefined workloads selected by a user, or user-specified applications and interactions). Thus, the minimum safe voltage is modified to reflect the operating environment and use cases of each individual system.

Figure 3:
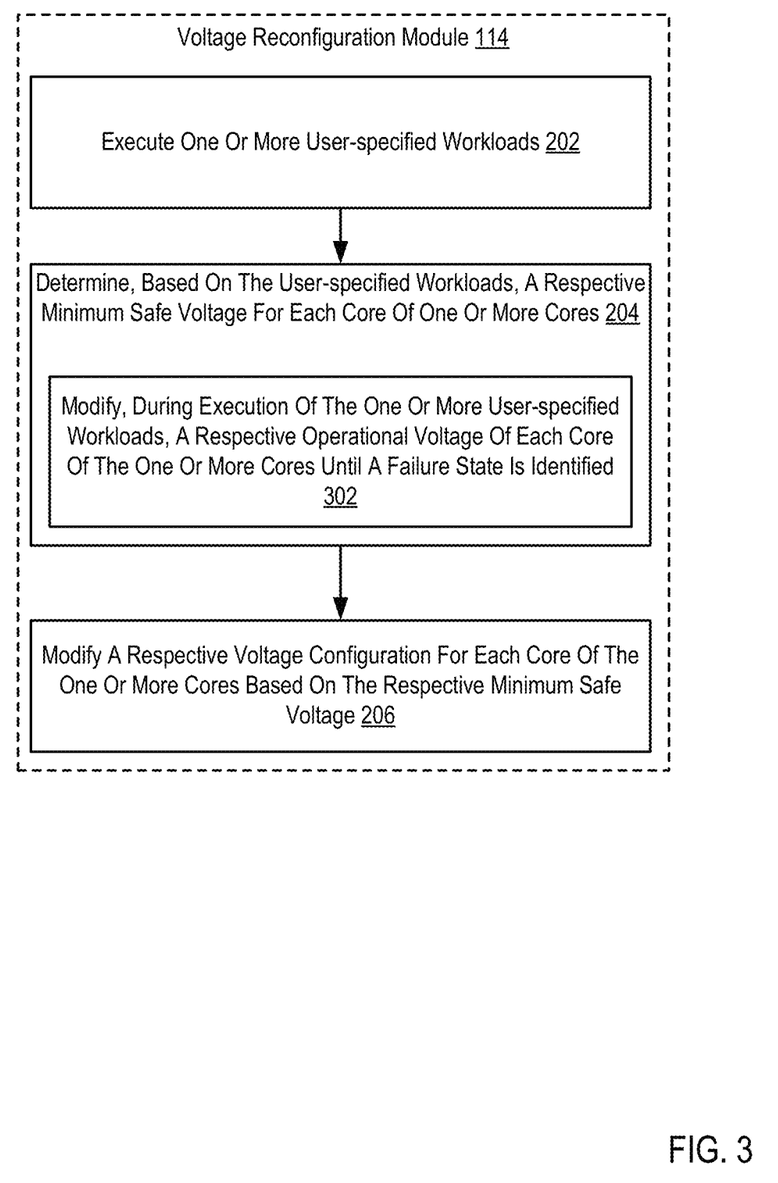
FIG. 3 is a flowchart of an example method for automatic voltage reconfiguration according to some embodiments.

For further explanation, FIG. 3 sets forth a flow chart illustrating an exemplary method for automatic voltage reconfiguration that includes executing 202 (e.g., by the voltage reconfiguration module 114) one or more user-specified workloads; determining 204, based on the user-specified workloads, a respective minimum safe voltage for each core of the one or more cores; and modify 206 a respective voltage configuration for each core of the one or more cores based on the respective minimum safe voltage.

The method of FIG. 3 differs from FIG. 2 in that determining 204, based on the user-specified workloads, a respective minimum safe voltage for each core of the one or more cores includes modifying 302, during execution of the one or more user-specified workloads, a respective operational voltage of each core of the one or more cores until a failure state is identified. For example, the voltage reconfiguration module 114 operates in parallel or as a background process to the one or more user-specified workloads and modifies the one or more cores to operate at different combinations or settings of operational voltages until a failure state is identified. Failure states include software crashes or exceptions, failure to maintain a particular quality of service for the one or more user-specified workloads, failure to complete an operation within a time threshold, or other criteria. The minimum safe voltage for a given core is then determined as a last tested operational voltage for the core that is greater than the operational voltage that caused the failure state.

Figure 4:
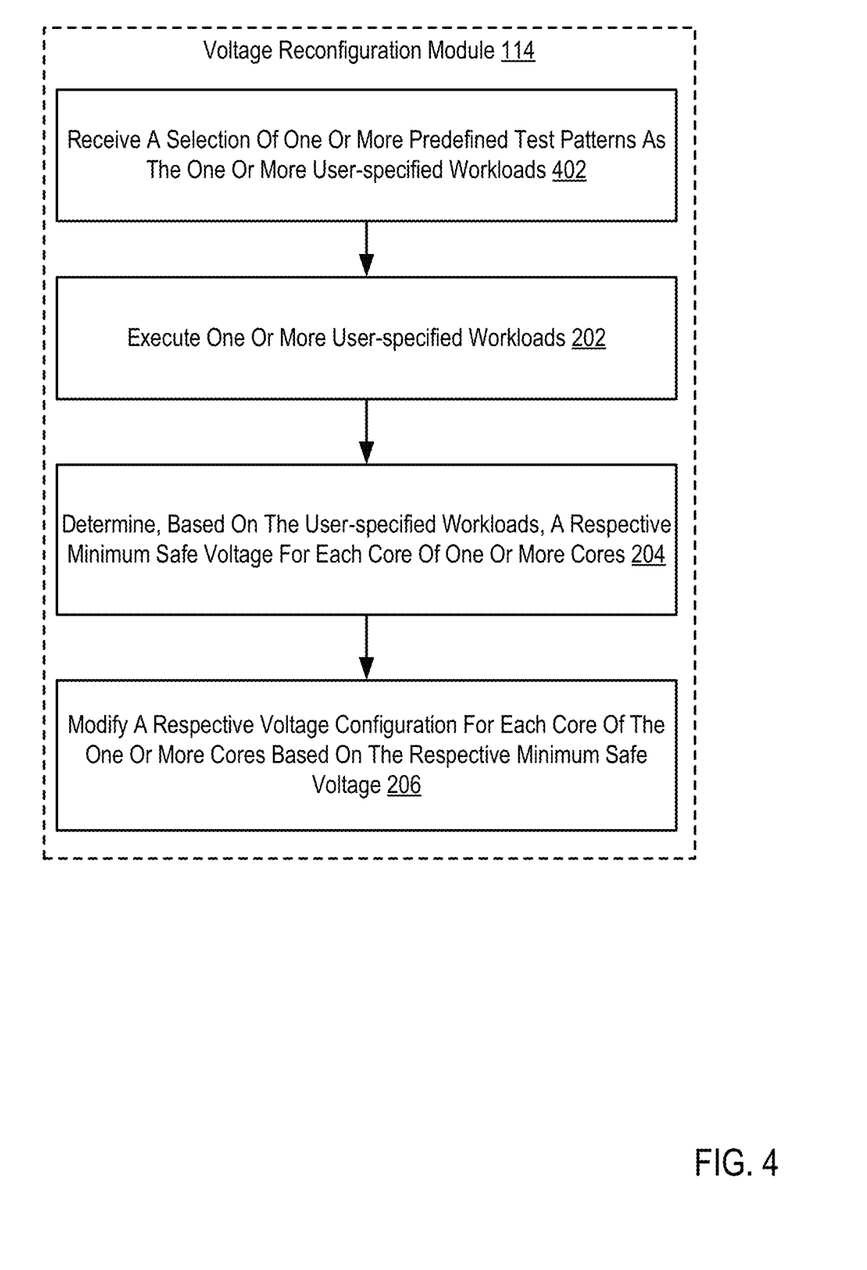
FIG. 4 is a flowchart of an example method for automatic voltage reconfiguration according to some embodiments.

For further explanation, FIG. 4 sets forth a flow chart illustrating an exemplary method for automatic voltage reconfiguration that includes executing 202 (e.g., by the voltage reconfiguration module 114) one or more user-specified workloads; determining 204, based on the user-specified workloads, a respective minimum safe voltage for each core of the one or more cores; and modify 206 a respective voltage configuration for each core of the one or more cores based on the respective minimum safe voltage.

The method of FIG. 4 differs from FIG. 2 in that the method of FIG. 4 also includes receiving 402 a selection of one or more predefined test patterns as the one or more user-specified workloads. In an embodiment, each of the predefined test patterns corresponds to a particular type or category of workload (e.g., code compilation, graphics rendering, data processing, database applications, data storage, networking, etc.). A user then selects one or more of the predefined test patterns to allow the voltage reconfiguration module 114 to automatically configure minimum safe voltages for each core according to the particular types of workloads selected. For example, a user selects workloads based on anticipated or desired use cases.

Figure 5:
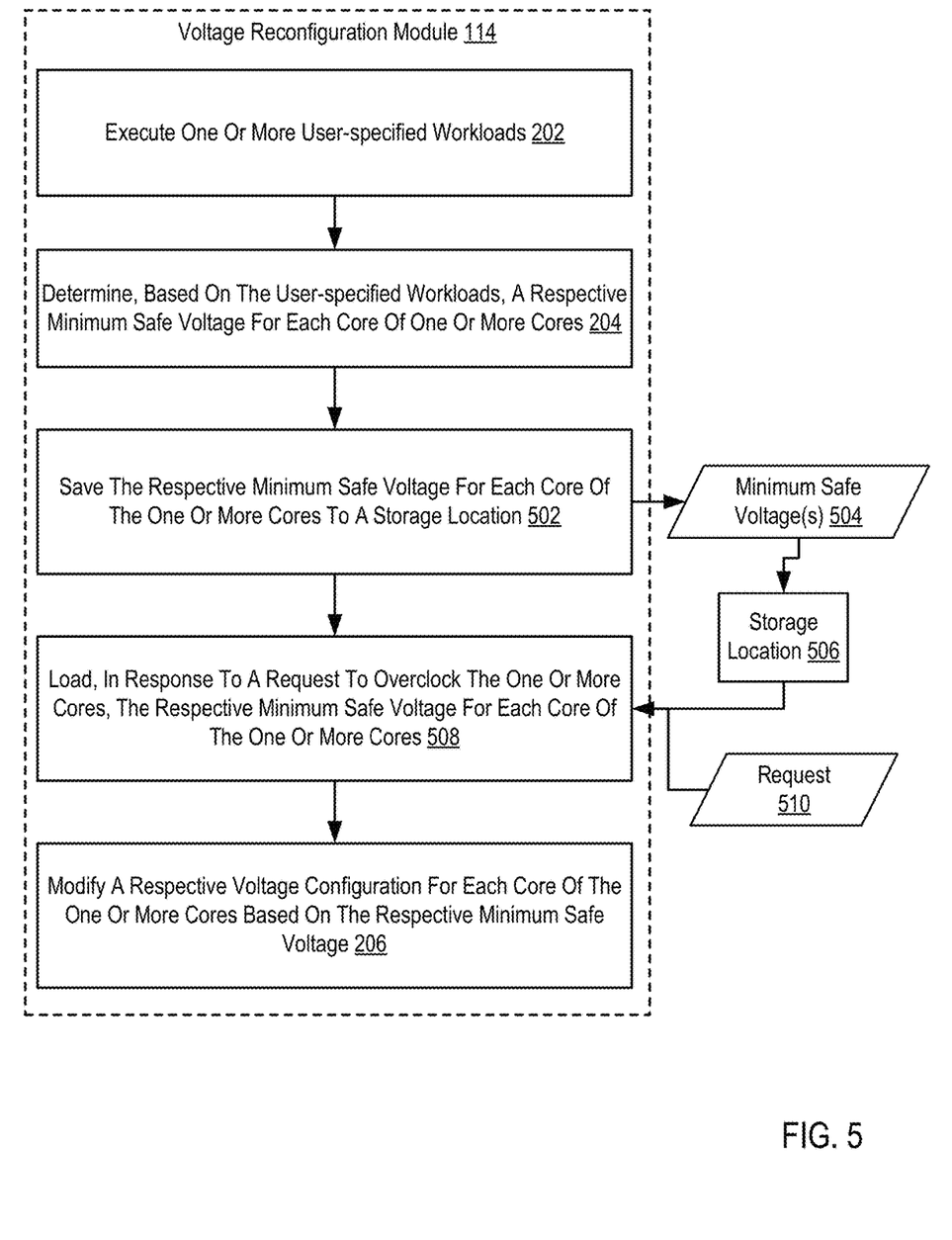
FIG. 5 is a flowchart of an example method for automatic voltage reconfiguration according to some embodiments.

For further explanation, FIG. 5 sets forth a flow chart illustrating an exemplary method for automatic voltage reconfiguration that includes executing 202 (e.g., by the voltage reconfiguration module 114) one or more user-specified workloads; determining 204, based on the user-specified workloads, a respective minimum safe voltage for each core of the one or more cores; and modify 206 a respective voltage configuration for each core of the one or more cores based on the respective minimum safe voltage.

The method of FIG. 5 differs from FIG. 2 in that the method of FIG. 5 also includes saving 502 the respective minimum safe voltage 504 for each core of the one or more cores to a storage location 506. In an embodiment, the storage location 506 includes non-volatile memory (e.g., disk storage) of a computer 100 executing the voltage reconfiguration module 114. In an alternative embodiment, the storage location 506 includes storage remotely disposed from the computer 100 executing the voltage reconfiguration module 114. For example, the storage location 506 includes a remote storage system such as a cloud storage system or network server.

The method of FIG. 5 also includes loading 508, in response to a request 510 to overclock the one or more cores, the respective minimum safe voltage 504 for each core of the one or more cores (e.g., from the storage location 506). In an embodiment, the request 510 to overclock the one or more cores is generated in response to a user input (e.g., to a user interface) to overclock the one or more cores. In an alternative embodiment, the request 510 to overclock the one or more cores is generated by an operating system 110 or application requesting that the one or more cores be overclocked. Where the storage location 506 is local non-volatile memory, the minimum safe voltages 504 are loaded from the non-volatile memory (e.g., into Random Access Memory or other memory). Where the storage location 506 is remote storage system (e.g., a cloud storage system or network server), the minimum safe voltages 504 are requested from the remote storage system. Thus, the respective voltage configurations are modified 206 using the loaded 508 minimum safe voltages 504.

In view of the explanations set forth above, readers will recognize that the benefits of automatic voltage reconfiguration according to embodiments of the present disclosure include:

Improved performance of a computing system by adjusting minimum safe operating voltages for cores to reflect actual operating environments and use cases.

Exemplary embodiments of the present disclosure are described largely in the context of a fully functional computer system for automatic voltage reconfiguration. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method of automatic voltage reconfiguration in a computer processor including one or more cores, the method comprising:
   executing one or more user-specified workloads;
   determining, based on the user-specified workloads, a respective minimum safe voltage for each core of the one or more cores; and
   modifying a respective voltage configuration for each core of the one or more cores based on the respective minimum safe voltage, wherein the respective voltage configuration comprises a margin of a frequency voltage curve.

2. The method of claim 1, wherein determining the respective minimum safe voltage for each core of the one or more cores comprises modifying, during execution of the one or more user-specified workloads, a respective operational voltage of each core of the one or more cores until a failure state is identified.

3. The method of claim 1, further comprising receiving a selection of one or more predefined test patterns as the one or more user-specified workloads.

4. The method of claim 1, wherein executing one or more user-specified workloads is based on one or more user interactions with one or more software applications.

5. The method of claim 1, further comprising saving the respective minimum safe voltage for each core of the one or more cores to a storage location.

6. The method of claim 5, further comprising loading, in response to a request to overclock the one or more cores, the respective minimum safe voltage for each core of the one or more cores.

7. An apparatus for automatic voltage reconfiguration in a computer processor including one or more cores comprising:
   a voltage configuration module configured to:
      execute one or more user-specified workloads;
      determine, based on the user-specified workloads, a respective minimum safe voltage for each core of one or more cores; and
      modify a respective voltage configuration for each core of the one or more cores based on the respective minimum safe voltage, wherein the respective voltage configuration comprises a margin of a frequency voltage curve.

8. The apparatus of claim 7, wherein determining the respective minimum safe voltage for each core of the one or more cores comprises modifying, during execution of the one or more user-specified workloads, a respective operational voltage of each core of the one or more cores until a failure state is identified.

9. The apparatus of claim 7, wherein the voltage configuration module is further configured to receive a selection of one or more predefined test patterns as the one or more user-specified workloads.

10. The apparatus of claim 7, wherein executing one or more user-specified workloads is based on one or more user interactions with one or more software applications.

11. The apparatus of claim 7, further configured to save the respective minimum safe voltage for each core of the one or more cores to a storage location.

12. The apparatus of claim 11, wherein the voltage configuration module is further configured to load, in response to a request to overclock the one or more cores, the respective minimum safe voltage for each core of the one or more cores.

13. A computer program product for automatic voltage reconfiguration a computer processor including one or more cores, the computer program product disposed upon a computer readable medium, the computer program product comprising computer program instructions that, when executed, cause a computer to perform steps comprising:
   executing one or more user-specified workloads;
   determining, based on the user-specified workloads, a respective minimum safe voltage for each core of one or more cores; and
   modifying a respective voltage configuration for each core of the one or more cores based on the respective minimum safe voltage, wherein the respective voltage configuration comprises a margin of a frequency voltage curve.

14. The computer program product of claim 13, wherein determining the respective minimum safe voltage for each core of the one or more cores comprises modifying, during execution of the one or more user-specified workloads, a respective operational voltage of each core of the one or more cores until a failure state is identified.

15. The computer program product of claim 13, wherein the steps further comprise receiving a selection of one or more predefined test patterns as the one or more user-specified workloads.

16. The computer program product of claim 13, wherein executing one or more user-specified workloads is based on one or more user interactions with one or more software applications.

17. The computer program product of claim 13, wherein the steps further comprise saving the respective minimum safe voltage for each core of the one or more cores to a storage location.

18. The method of claim 3, wherein the one or more predefined test patterns are selected from a plurality of test patterns each corresponding to a particular category of workload.

19. The apparatus of claim 9, wherein the one or more predefined test patterns are selected from a plurality of test patterns each corresponding to a particular category of workload.

20. The computer program product of claim 15, wherein the one or more predefined test patterns are selected from a plurality of test patterns each corresponding to a particular category of workload.

* * * * *